United States Patent [19]

Enomoto et al.

[11] Patent Number: 5,360,870
[45] Date of Patent: Nov. 1, 1994

[54] RESIN, PROCESS FOR PREPARING THE SAME, AND COMPOSITION COMPRISING THE SAME

[75] Inventors: Masami Enomoto; Hitoshi Yuasa; Fumiaki Oshimi; Yutaka Otsuki, all of Yokohama, Japan

[73] Assignee: Nippon Oil Co., Ltd., Japan

[21] Appl. No.: 743,367

[22] PCT Filed: Dec. 20, 1990

[86] PCT No.: PCT/JP90/01666
§ 371 Date: Aug. 19, 1991
§ 102(e) Date: Aug. 19, 1991

[87] PCT Pub. No.: WO91/09062
PCT Pub. Date: Jun. 27, 1991

[30] Foreign Application Priority Data

Dec. 20, 1989 [JP] Japan .................... 1-330090

[51] Int. Cl.⁵ .................. C08F 8/00; C08L 61/04
[52] U.S. Cl. ......................... 525/109; 525/117; 525/122; 525/523; 525/534; 528/96; 528/97
[58] Field of Search ............... 525/109, 122, 117, 523, 525/534; 528/96, 97

[56] References Cited

U.S. PATENT DOCUMENTS 3,057,614 10/1962 Greenlee ..................... 525/109
3,258,450 6/1966 Aronoff et al. ............... 525/122

FOREIGN PATENT DOCUMENTS 54-160453 12/1979 Japan .
61-163904 7/1986 Japan .
63-110213 5/1988 Japan .
1106267 2/1967 United Kingdom .

Primary Examiner—Melvyn I. Marquis
Assistant Examiner—Randy Gulakowski
Attorney, Agent, or Firm—Ostrolenk, Faber, Gerb & Soffen

[57] ABSTRACT

A novel hydroxyphenylated resin having excellent thermal stability, weather resistance, and electrical properties useful as a resin for a printed circuit board, a resin for sealing a semiconductor, an insulating materials, and the like; a process for preparing the resin; and curable epoxy composition comprising the same. Specifically, the present invention provides a novel resin containing a number of phenolic hydroxyl groups and having a high softening point and substantially no double bonds; and a process for preparing the same wherein a butadiene oligomer and a phenol compound are used as starting materials; and a curable epoxy resin composition comprising the same suitable for applications such as a sealing material.

12 Claims, 9 Drawing Sheets

*IMPURITY OF SOLVENT

*IMPURITY OF SOLVENT

ELUTION TIME (min.)

ELUTION TIME (min.)

ELUTION TIME (min.)

ELUTION TIME (min.)

*IMPURITY OF SOLVENT

RESIN, PROCESS FOR PREPARING THE SAME, AND COMPOSITION COMPRISING THE SAME

FIELD OF THE INVENTION

The invention relates to a novel hydroxyphenylated resin having excellent thermal stability, weather resistance and electrical properties useful as a resin for printed circuit boards, a resin for sealing semiconductors, a resin for insulting materials, and the like. Further, the present invention relates to a process for preparing the same and a curable epoxy resin composition comprising the same.

BACKGROUND OF THE INVENTION

Semiconductor and the associated technologies have made remarkable progress in recent years. Concomitantly, the degree of integration of large scale integration (LSI) has more and more increased, resulting in a rapid progress of miniaturization of wiring and enlargement of tip size. With increase in the degree of integration of LSI memory, packaging methods are shifting over from through-hole packagings to surface packagings. That is, packaging methods have been shifting over from conventional dip-type packagings to surface packagings such as small-sized and thin-type flat packagings, small outline packages, J Bend Soic, plastic leaded chip carriers and the like.

As the result, problems such as package cracking and impairment of moisture resistance of the package due to the package cracking are becoming an issue. Especially, a rapid change in temperature of a package during the soldering operation of lead wires at the surface packaging step creates many troubles such as package cracking.

Epoxy resin curing agents commonly used in sealing compounds for semiconductors are phenol-type novolac resins or cresol-type novolac resins, said compounds being compounded with the same resins.

The main drawback of the epoxy resin compositions containing said curing agents is their susceptibility to cracking and the lack of moisture resistance. Because of this, such compounds can not follow effectively the rapid progress of the recent semiconductor technology.

To surmount the drawback, Japanese Provisional Publication No. 110213-63 discloses a moisture and thermal resistance phenolic resin, for example, a dicyclopentadiene derivative of a phenolic resin useful as epoxy resin curing agents. However, one of the disadvantages of the dicyclopentadiene derivative of phenolic resin is its poor moldability, and only at most, the dimer and trimer of cyclopentadiene may be used because the softening point of the derivative should be suppressed as much as possible. As a result, the glass transition point (Tg) of the resulting sealing compound is difficult to raise, and the electrical properties of the compound can not be improved.

Several processes for preparing a phenolic resin derivative by use of a low molecular weight butadiene polymer or copolymer as a starting material have been proposed. U.S. Pat. No. 3,258,450 discloses a process comprising addition of phenol to a low molecular butadiene polymer or copolymer in the presence of an activated clay or sulfuric acid as a catalyst. The problem of this process is that only addition polymers or copolymers having a softening point less than 22° C. may be obtained. U.K. No. 1,106,267 also discloses a process comprising addition of phenol to the double bonds of a low molecular weight butadiene polymer or copolymer in the presence of phosphoric acid as a catalyst. Although the resulting resin has a relatively high softening point, the main disadvantage of the phenolic resin is the carbon-carbon double bonds remain in the molecule in a large number, and thus when it is used as a curing agent for sealing compounds, the long-term storage stability impaired.

A process comprising addition of phenol to the double bonds of a low molecular butadiene polymer or copolymer in the presence of perchloric acid as a catalyst has been proposed [Angew. Makromol. Chem., 24, 205 (1972)]. The problems of the process are also the remaining carbon-carbon double bonds as well as the side reactions of phenol which produce various higher molecular weight butadiene polymers and ether-type adduct other than the desired phenol adduct. Therefore, the phenolic resins obtained by the process are also not suitable for use as a resin for sealing compounds and the like.

Further, Japanese Provisional Publication No. 26894-54 describes a process for preparing a phenol adduct of polybutadiene comprising an installment addition of a low molecular weight butadiene polymer or copolymer to a mixture of phenol and $BF_3$ ether complex. In such case, although higher molecular weight butadiene polymers may be suppressed, a large number of carbon-carbon double bonds may remain in the molecule of the resulting adduct. Furthermore, a process for preparing a phenol adduct of polybutadiene has been known wherein the process comprises reacting phenol with a low molecular weight butadiene polymer or copolymer in the presence of $BF_3$ phenol complex as a catalyst (Japanese Provisional Publication No. 160453-54). The problems of this process are the unpreferable properties of the product having a softening point less than 75° C., and the large number of remaining double bonds.

DISCLOSURE OF THE INVENTION

The present invention provides a novel resin containing a number of phenolic hydroxyl groups and having a high softening point and substantially no double bonds, and a process for preparing the same. The invention also relates to a curable epoxy resin composition comprising said resin, suitable for use of sealing compounds and the like.

Applicant has concentrated energy on the solution of the aforesaid problems and unexpectedly found out that when the reaction of phenol with a low molecular weight butadiene polymer is carried out while strictly controlling the amount of water in the reaction system, a desirable novel resin can be conveniently obtained.

The first aspect of the invention is directed to a novel resin having a number average molecular weight of about 500 to 5,000, and represented by the following general formula:

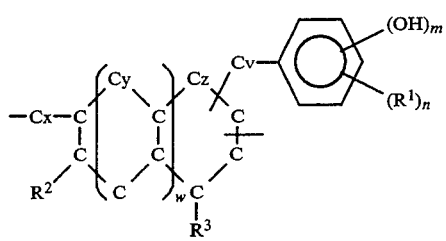 (I)

[wherein $R^1$ is a hydrogen atom, a halogen atom, or an alkyl group having 1 to 4 carbon atoms, $R^2$ or $R^3$ is hydrogen atom, a methyl or ethyl group, m is 1 or 2, n is 0 to 2, x is 1 or 2, y, z and v are individually 0 or 1, w is 0 to 2, and a sum total of carbon numbers except those of the hydroxy phenyl group, are multiples of 4].

The second aspect of the present invention is directed to a process for preparing a hydroxy (alkyl) phenylated resin having a number average molecular weight of about 500 to 5,000 and substantially no double bonds [hereinafter referred to as resin (a)], wherein said process comprises the reaction of a butadiene polymer having a number average molecular weight of 300 to 3,000 with an alkylphenol represented by the following general formula:

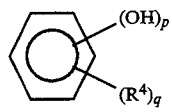 (II)

[wherein $R^4$ is a halogen atom or an alkyl group having 1 to 4 carbon atoms, p is 1 or 2, and q is 1 or 2] in the presence of $BF_3$ and/or a $BF_3$ complex as a catalyst at a temperature of about 50° to 120° C. while controlling the amount of water in the reaction system less than 100 ppm by weight.

The third aspect of the present invention is directed to a process for preparing a hydroxy (alkyl) phenylated resin having a number of average molecular weight of about 500 to 5,000 and represented by the following general formula:

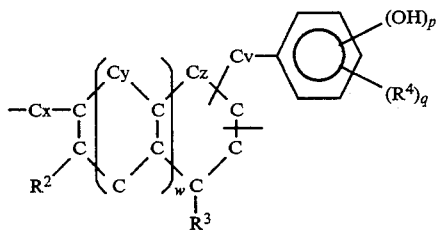 (III)

[wherein $R^2$ and $R^3$ are individually a hydrogen atom, a methyl or ethyl group, $R^4$ is a halogen atom or an alkyl group having 1 to 4 carbon atoms, p is 1 or 2, q is 0 to 2, x is 1 or 2, y, z and v are individually 0 or 1, w is 0 to 2, and a sum total of carbon numbers except ones of the hydroxyphenyl group, which are multiples of 4], wherein said process comprises the reaction of a butadiene polymer having an average molecular weight of 300 to 3,000 with an alkylphenol presented by the following general formula:

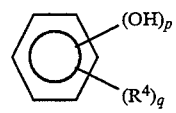 (II)

[wherein $R^4$ is a halogen atom or an alkyl group having 1 to 4 carbon atoms, p is 1 or 2, and q is 1 or 2] in the presence of $BF_3$ and/or a $BF_3$ complex at a temperature of about 50° to 120° C. while severely controlling the amount of water in the reaction system less than 100 ppm weight.

The forth aspect of the invention is directed to a process for preparing a hydroxy (alkyl) phenylated resin [hereinafter referred to as resin (b)] having a number average molecular weight of 500 to 5,000 and substantially no double bonds, wherein said process comprises the reaction of a butadiene polymer having a number average molecular weight of 300 to 3,000 with a phenol represented by the following general formula:

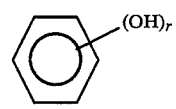 (IV)

[wherein r is 1 or 2] in the presence of $BF_3$ and/or a $BF_3$ complex at a temperature of about 50° to 120° C. while severely controlling the amount of water in the reaction system less than 100 ppm by weight under an installment addition of said butadiene polymer to a mixture of said phenol and $BF_3$ and/or a $BF_3$ complex.

The fifth aspect of the present invention is directed to a process for preparing a hydroxy phenylated resin having a number average molecular weight of about 500 to 5,000, and represented by the following formula:

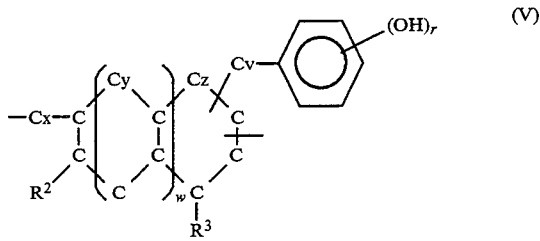 (V)

[wherein each $R^2$ and $R^3$ is a hydrogen atom, a methyl or ethyl group, r is 1 or 2, x is 1 or 2, y, z and v are individually 0 or 1, w is 0 to 2, and a sum total of carbon numbers except those of the hydroxy phenyl group], wherein said process comprises the reaction of a butadiene polymer having a number average molecular weight of 300 to 3,000 with a phenol represented by the following formula:

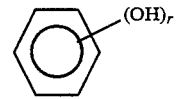 (IV)

[wherein r is 1 or 2] in the presence of $BF_3$ and/or a $BF_3$ complex at a temperature of about 50° to 120° C. while severely controlling the amount of water in the reaction system less than 100 ppm by weight under an installment addition of said butadiene polymer to a mixture of said phenol and BF₃ and/or a BF₃ complex.

The sixth aspect of the present invention is directed to a curable epoxy resin composition comprising aforesaid hydroxy (alkyl) phenylated resin [(I), (a), (III), (b), or (V)]. That is, said curable epoxy resin composition comprises, as the essential components:

(A) about 100 parts by weight of aforesaid hydroxy (alkyl) phenylated resin,
(B) about 20 to 120 parts by weight of a curable epoxy resin, and
(C) about 0.05 to 5.0 parts by weight of an accelerator.

Especially, the curable epoxy resin compositions of the present invention are suitable for preparing sealant compositions and the like.

More concretely, "substantially no double bond" in resin (a) or resin (b) means that the double bond content of the resin (a) or (b) prepared by the present invention is in an amount less than about 2% by mole, that is, over 98% by mole of the double bonds present in the starting low molecular weight butadiene polymer is consumed by reaction.

In the present invention, hydroxy (alkyl) phenylated resins [resin (I), (a), (III), (b) and (V)], the ratio of the hydroxy (alkyl) phenyl groups in the resin to the degree of cyclization of polycycloalkane ring in the main chains of the polymer is usually from 1/1 to $\frac{1}{3}$.

The term "the degree of cyclization of polycycloalkane ring in the main chains of the polymer" means the number of cycloalkane ring present in the main chains of the polymer, for example, the number of rings being 1 in case of a cyclohexane or cyclopentane rings and the number of ring being 2 in case of a bicyclo ring such as decahydronaphthalene ring. The reason for such definitions being necessary is closely connected with the essence of the present invention.

Generally, alkylation of an olefin with a phenol by Friedal-Crafts reaction is a equimolecular reaction of the carbon-carbon double bond with the phenol in a ratio of 1:1. Polymerization between olefins or a cross-linking reaction of olefins via the phenol may occur as side reactions.

In the present invention, although the reaction proceeds to such an extent that the double bonds in the starting polymer are substantially consumed, the equimolecular amount of phenol corresponding to the consumed double bonds does not undergo an alkylation reaction with the olefinic bonds.

More specifically, the double bonds which are linked to the phenol are at most 50% by mole of the double bonds initially present, usually about 25 to 50% by mole.

That is, a large number of double bonds in the butadiene polymer is consumed by side reactions other than alkylation reaction.

GPC analysis shows that the increase in molecular weight of the low molecular weight butadiene polymer during the present reaction is exclusively due to the alkylation reaction of the phenol. In other words, polymerization between butadiene polymers via double bonds to produce higher polymers, or cross-linking reaction of said double bonds via a phenol does not occur. This means that in the present invention, inner cyclization is the only side reaction. Therefore, the double bonds present in the starting butadiene polymer are consumed solely by alkylation of the phenol and inner cyclization of the butadiene polymer, not by the other side reactions. As the result, in the present invention "the degree of cyclization of polycycloalkane in the main chains" is defined as the balance between equivalent moles of double bonds in the starting butadiene polymer and the moles of alkylated phenol.

A ratio in moles of hydroxy phenyl groups to the degree of cyclization of cycloalkane in the main chains is 1/1 to $\frac{1}{3}$.

In the present invention, cyclization proceeds to such an extent that substantially all double bonds remaining in the starting polymer is consumed. Generally, such cyclization may occur partly during the reaction between a low molecular weight butadiene polymer and a phenol.

However, there is no precedent reaction like the present one in which cyclization proceeds completely to such an extent that substantially all double bonds are consumed without any polymerization via double bonds.

Although the reaction of the present invention is of scientific interest, it may further produce profitable results in industrial fields because the resins prepared by the present process has a number of reactive hydroxyphenyl groups as well as an excellent thermal stability due to the absence of double bonds which enable us to handle the resin stable even at a temperature over about 300° C.

The resins of the present invention can be obtained only when severely controlling the amount of water in the reaction system less than about 100 ppm by weight.

The reaction system containing water more than about 100 ppm by weight produces a resin having a large number of double bonds.

A hydroxyphenylated resin of the present invention is represented by the following general formula:

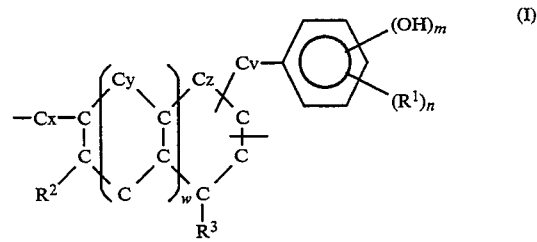

(I)

[wherein R¹ is a hydrogen atom, a halogen atom, or an alkyl group having 1 to 4 carbon atoms, R² or R³ is a hydrogen atoms, a methyl or ethyl group, m is 1 or 2, n is 0 to 2, x is 1 or 2, y, z and v are individually 0 or 1, w is 0 to 2, and a sum total of carbon numbers except those of the hydroxy phenyl group are multiples of 4].

In such case, the sites to which hydroxy (alkyl) phenyl groups attach can not be specified because the starting butadiene polymer is a mixture of polybutadienes having both 1,2- and 1,4 type unsaturations as shown in below.

 (1,2-type)

 (1,4-type)

Suppose the following structural formula (M) of a butadiene polymer. In such case, the following phenol adduct (N) may be the main product.

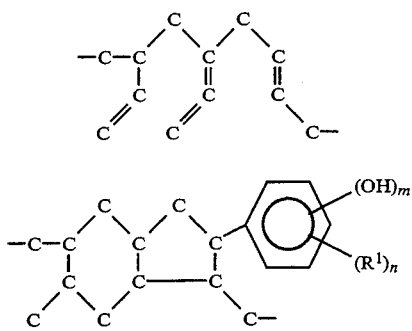

DETAILED DESCRIPTION OF THE INVENTION

The low molecular weight butadiene polymer of the present invention has a number average molecular weight of 300 to 3,000, preferably 500 to 2,000. As a process for preparing such butadiene polymers, there may be employed a well known process such as an anionic polymerization process wherein butadiene is polymerized in the presence of an alkali metal or alkaline organometallic compound as a catalyst at a temperature of about 0° to 100° C. Of these, the following processes are most preferable to be employed, because light-colored and less gel content resins can be obtained by controlling the molecular weight of the resulting polymers; a chain transfer process wherein an alkaline organometallic compound such as sodium benzyl, and an alkylaryl compound such as toluene are used as a catalyst and a chain transfer agent respectively (Japanese Publication No. 15586-54), a living polymerization process wherein a tetrahydrofuran solution of a polycyclic aromatic compound such as naphthalene, and alkali metal such as sodium are used as an activator and a catalyst respectively (Japanese Publication No. 27432-43), a polymerization process wherein a dispersion of an alkali metal such as sodium, an ether such as dioxane, and an aromatic hydrocarbon such as toluene or xylene are used as a catalyst, molecular weight regulator and solvent respectively (see, Japanese Publication No. 7446-32,10188-34 and 1245-38), and a coordination anion polymerization process wherein an alkyl aluminum halogenide and acetyl acetonate of the metal such as cobalt or nickel of the periodic table VIII are used as a catalyst (Japanese Nos. 507-45 and 80300-46).

As a low molecular weight butadiene copolymer of the invention, a low molecular weight butadiene copolymer prepared by copolymerization of butadiene with a diene such as isoprene or 1,3-pentadiene or with an aromatic vinyl monomer (about 30% by weight based on the weight of butadiene) may be employed.

An aromatic vinyl monomer such as styrene, α-methyl styrene, vinyl toluene, or vinyl benzene may be used as the aromatic vinyl comonomer.

The phenols used in the present invention are alkylphenols (II) and/or phenols (IV) represented by the following general formula:

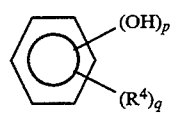

[wherein $R^4$ is a halogen atom or an alkyl group having 1 to 4 carbon atoms, p is 1 or 2, and q is 1 or 2]

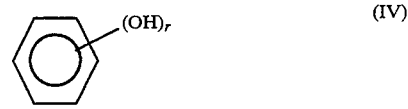

[wherein r is 1 or 2].

Typical examples of the phenols include o-cresol, m-cresol, p-cresol, 2,6-dimethyl phenol, 2,4-dimethyl phenol, bromophenol, 2-methyl hydroquinone, phenol, hydroquinone, resorcine, catechol, and the like. From economic and manufacturing points of view, cresol and xylenols are preferred.

To the double bonds in the starting butadiene polymer, an excess of the equimolecular amount of alkylphenols (II) and phenols (IV) is necessary to be fed into the reaction system, with the amount of 1.2 to 2 moles being preferred. That is, preferable molar ratio of the phenol linked to the double bonds is about 0.25 to 0.5, more preferably about 0.27 to 0.45. When the phenol is less than 1.2 times in mole terms, polymerization as a side reaction may occur, and inversely when it is more than 2 times in mole, it becomes uneconomical.

The catalyst used in the present invention is selected from the group consisting of $BF_3$ and $BF_3$ complexes, with the preferred complex being ether complex or phenol complex.

The catalyst is required in an amount of about 5 to 50 millimoles, preferably about 10 to 20 millimoles (as $BF_3$) based on 100 grams of the butadiene polymer used.

Preferable reaction temperature is about 50° to 120° C., and more preferably is about 70° to 100° C. When the temperature is less than 50° C., it serves to slow down the rate of the reaction unpreferably, and inversely, when it is more than 120° C., decomposition of catalyst and evolution of a corrosive gas occurs.

In the present invention, cyclization of double bonds occurs parallel to the addition reaction of phenol to the double bonds, and a large quantity of reaction heat is evolved by the reaction system. Therefore, successive addition of the catalyst and/or butadiene polymer in a small quantity is preferable to control the reaction temperature. Especially, successive addition of butadiene polymer is recommended for the case of phenols represented by the following general formula:

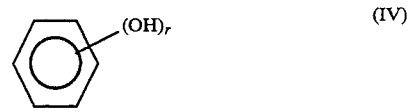

[wherein r is 1 or 2].

It is one of the characteristics of the present invention that, when the reaction temperature is maintained at the aforesaid range for a period of 1 to 8 hours by a successive addition procedure, the properties of the resulting adduct can be remained unchanged over the duration of reaction. The reason may be that, when an excess equimolecular amount of phenol is present in the system, polymerization to produce various higher polymers and other side reactions are inhibited by prompt consumption of double bonds of the butadiene polymer in the reaction system by alkylation and cycliyzation reactions.

No specific solvent is necessary in the present invention because unreacted phenol compound fills the role of the solvent. However, a small amount of inactive solvent such as toluene, xylenes and the like may be employed, if necessary, to lower the viscosity and the freezing point of the system.

In the present invention, the amount of water in the reaction system is less than 100 ppm by weight, preferably less than about 60 ppm by weight. When the amount of water is more than 100 ppm by weight, the softening point of the resulting hydroxyphenylated butadiene polymer derivative becomes low unpreferably, and the double bond of the derivative can not be reduced substantially. As a result, butadiene polymer derivatives having excellent thermal stability, weather resistance, storage stability and electrical properties can not be obtained.

In order to maintain the water content in the reaction system less than 100 ppm by weight, there may be preferably employed a process comprising using a freshly distilled phenol compound obtained by rectification of a conventional phenol compound containing about 1 to 2% by weight of water or a process comprising using a dried phenol compound obtained by drying through molecular sieves or active alumina. But from an industrial point of view, a process comprising using dried raw materials obtained by azeotropic distillation of a mixture of a butadiene polymer and a phenol in the presence of toluene or xylenes in an amount of about 5 to 20% by weight based on the mixture is most preferable.

In the present invention, although the molar ratio of the linked phenol compound to the double bonds of butadiene polymer is 0.25 to 0.50, substantially no double bond remains in the resulting adduct after completion of the reaction and the increase of the molecular weight of the product is equivalent to the amount of the phenol compound linked to the double bonds.

This shows that the disappearance of the excess double bonds depends on the above-mentioned inner cyclization reaction of the double bonds.

It is supposed that the activity of the catalyst for cyclization reaction may be increased as the amount of water is decreased.

In order to link the phenol compound to the double bonds of the butadiene polymer by alkylation as much as possible, it is required to feed the phenol compound in excess of the amount needed to saturate the double bonds.

The hydroxyphenylated resin of the present invention has a softening point (ring and ball method, JIS K-2531-60) of more than about 90° C., preferably about 100° to 200° C.

The present resin [resin (I), (a), (III), (b) or (V)] is useful as a resin for a curable epoxy resin composition of the present invention. The epoxy composition comprises, as essential components,:

(A) about 100 parts by weight of the above-mentioned hydroxyphenylated resin of the present invention, (B) about 20 to 120 parts by weight of a curable epoxy resin, and (C) about 0.05 to 5.0 parts by weight of an curing accelerator.

A novolac-type phenolic resin such as Tamanol-758, Tamanol-759 (trade name, made by Arakawa Chemicals Ind. Lid.), and ECM-1280 (trade name, made by Ciba-Giegy) may jointly used with component (A). Multifunctional phenolic compounds such as bromo-novolac-type phenolic resins, polyvinylphenol, bromopolyvinylphenol or tetrabromobisphenol A may be used optionally. The preferable amount of these optional components is less than about 100 parts by weight, more preferably about 50 parts by weight based on 100 parts by weight of component (A). When it is more than about 100 parts by weight, the moisture resistance impaires unpreferably.

Examples of a curable epoxy resin having at least one, preferably at least two epoxy groups in a molecule of the resin include epoxy resins obtained from cpichlorohydrin and bisphenol A, novolac-type epoxy resins, alicyclic epoxy resins, chlorinated or brominated epoxy resins, and mixtures thereof. As for the multifunctional epoxy resin, a novolac-type epoxy resin, SUMIEPOXY ESCN-220L (trade name, made by Sumitomo Chemicals Ind. Ltd.), QUATREX 2410 (trade name, made by Dow Chemical Co. Ltd.), YDCN-702P and YDCN-703S (trade names, made by Toto Kasei Co. Ltd.) may be used preferably. Further, multifunctional epoxy resins may be blended with component (B).

Any compounds suitable as chemicals for sealing compounds may be used as component (C) which can accelerate the rate of reaction of epoxy group with phenolic hydroxy group. Examples of such compounds include tert.-phosphines, imidazoles, tert.-amines, and the like. More specifically, tert.-phosphines represented by the following general formula:

[wherein, $R^5$, $R^6$, or $R^7$ are the same or different and are a hydrogen atom, alkyl or aryl group having 1 to 10 carbon atoms] are employed preferably.

Typical examples of the accelerators include triethyl phosphine, tributyl phosphine, triphenyl phosphine, and the like.

Examples of such tert.-amine include dimethylethanolamine, dimethylbenzylamine, 2,4,6-tris (dimethylamino) phenol, 1,8-diazabicyclo [5,4,0] undecene, and the like.

Examples of such imidazoles include 2-ethyl-4-methylimidazole, 2,4-dimethylimidazole, 2-methylimidazole, 2-undecylimidazole, 2-heptadecylimidazole, 1-vinyl-2-methylimidazole, 1-propyl-2-methylimidazole, 2-isopropylimidazole, 1-cyanoethyl-2-ethylimidazole, 1-cyanoethyl-2-ethyl-4-methylimidazole, 1-cyanoethyl-2-undecylimidazole, 1-cyanoethyl-2-phenylimidazole, 2-phenylimidazole, 1-benzyl-2-methylimidazole, 2-phenyl-4-methylimidazole, 2-phenyl-4,5-dihydroxymethylimidazole, 2-phenyl-4-methyl-5-hydroxymethylimidazole, and the like.

Among them, 2-methylimidazole (2 Mz), diazabicycloundecene (DBU), triphenylphosphine (TPP), dimethylbenzylamine (BDMA), or mixtures thereof is employed preferably.

A curable epoxy composition of the present invention may be contain optionally a silica-type powdery filler; a silane-type coupling agent; a flame retardant such as a bromine-type epoxy-resin, $Sb_2O_3$, and hexabromobenzene; a colorant such as carbon black and iron red; a release agent such as natural waxes and synthetic waxes; silicon oil; and a stress resistance additive such as clastomers.

A process for preparation of the epoxy resin compounds of the present invention comprises the steps of mixing homogeneously the components such as an epoxy resin, a curing agent, an accelerator, filler and the like by means of a mixer, kneading in fusion, cooling and crashing the resulting mixture to give a desired molding composition.

The molding composition of the present invention is suitable for application such as a coating, insulating, and sealing material in particular in the field of elctronic and electrical industries. The setting products obtained from the composition have excellent mechanical and electrical properties and good cracking resistance.

In the accompanying drawings;

FIG. 1 is the IR spectrum of NISSEKI POLYBUTADIENE B-1000 (trade name, made by Nippon Petrochemicals, Co, Ltd.) used in the present invention as a raw material, FIG. 2 is the IR spectrum of O-cresol adduct of polybutadiene (A-1), FIG. 3 is the $^1$H-NMR spectrum of NISSEKI POLYBUTADIENE B-1000 (trade name; made by Nippon Petrochemicals, Co, Ltd.), FIG. 4 is the $^1$H-NMR spectrum of o-cresol adduct of polybutadiene (A-1), FIG. 5 is the GPC spectrum of NISSEKI POLYBUTADIENE B-1000, FIG. 6 is the GPC spectrum of o-cresol adduct (A-1), FIG. 7 is the IR spectrum of phenol adduct (A-3), FIG. 8 is the $^1$H-NMR spectrum of phenol adduct (A-3), FIG. 9 is the GPC spectrum of NISSEKI POLYBUTADIENE B-700, FIG. 10 is the GPC spectrum of phenol adduct (A-3)

MOST PREFERABLE EMBODIMENTS OF THE INVENTION

The invention is disclosed, by way of illustration, in the examples in the following description.

EXAMPLE 1

In a 3-liter separable flask fitted with a stirrer, inner cooling coil, dropping funnel, reflux condenser and Liebig cooler were placed 350 grams of NISSEKI POLYBUTADIENE B-1000 (number average molecular weight is 1,000, 65% 1,2-double bonds, 35% 1,4-double bonds), and 950 grams of o-cresol and 300 grams of toluene in a nitrogen atmosphere, followed by immersion of the flask into an oil-bath. Afterwards, the flask was heated up to a temperature of about 180° C. and stirring was continued so that a total of 240 grams of water and toluene was distilled off. The analysis by means of Karl-Fischer apparatus shows that the water content of the raw materials was 50 ppm by weight.

The dried starting materials in the flask were cooled to about 50° C., followed by dropwise addition of 12.5 grams of RF$_3$ phenol complex over a period of about 1 hour. Although there was an increase in temperature of the contents by reaction heat with addition of catalyst, the temperature was so controlled that it reaches generally to about 80° C. upon the completion of the addition of catalyst.

After completion of the addition of catalyst, stirring was further continued for 2 hours at a temperature of about 80° C., followed by addition of 12.5 grams of sodium hydroxide to complete the reaction.

To the reaction solution was added 300 grams of toluene to decrease the viscosity, followed by filtration of catalyst residue from the solution. The filtrate was concentrated by distillation to obtain about 490 grams of a cresol adduct. About 675 grams of unreacted o-cresol was recovered.

The resulting o-cresol adduct of the polybutadiene have had a sotening point of 170° C. and OH-value [I.F.C. Ana]. Edy, 17, 394 (1945), "Quantitative Organic Analysis via Functional Group"] of 310 mmoles/100 g-resin. The IR and $^1$H-NMR spectra of the starting polybutadiene and the adduct so obtained are set forth in FIGS. 1 to 2 and 3 to 4 respectively, the spectrum of the adduct showing no absorption in IR due to double bonds at 910, 960, 990 and 1640$^{-1}$ and no proton absorption in $^1$H-MNR due to double bonds at δ4.6 to 5.6 ppm. Therefore, it shows clearly the complete disappearnace of the double bonds of the polybutadiene.

Figure 1:
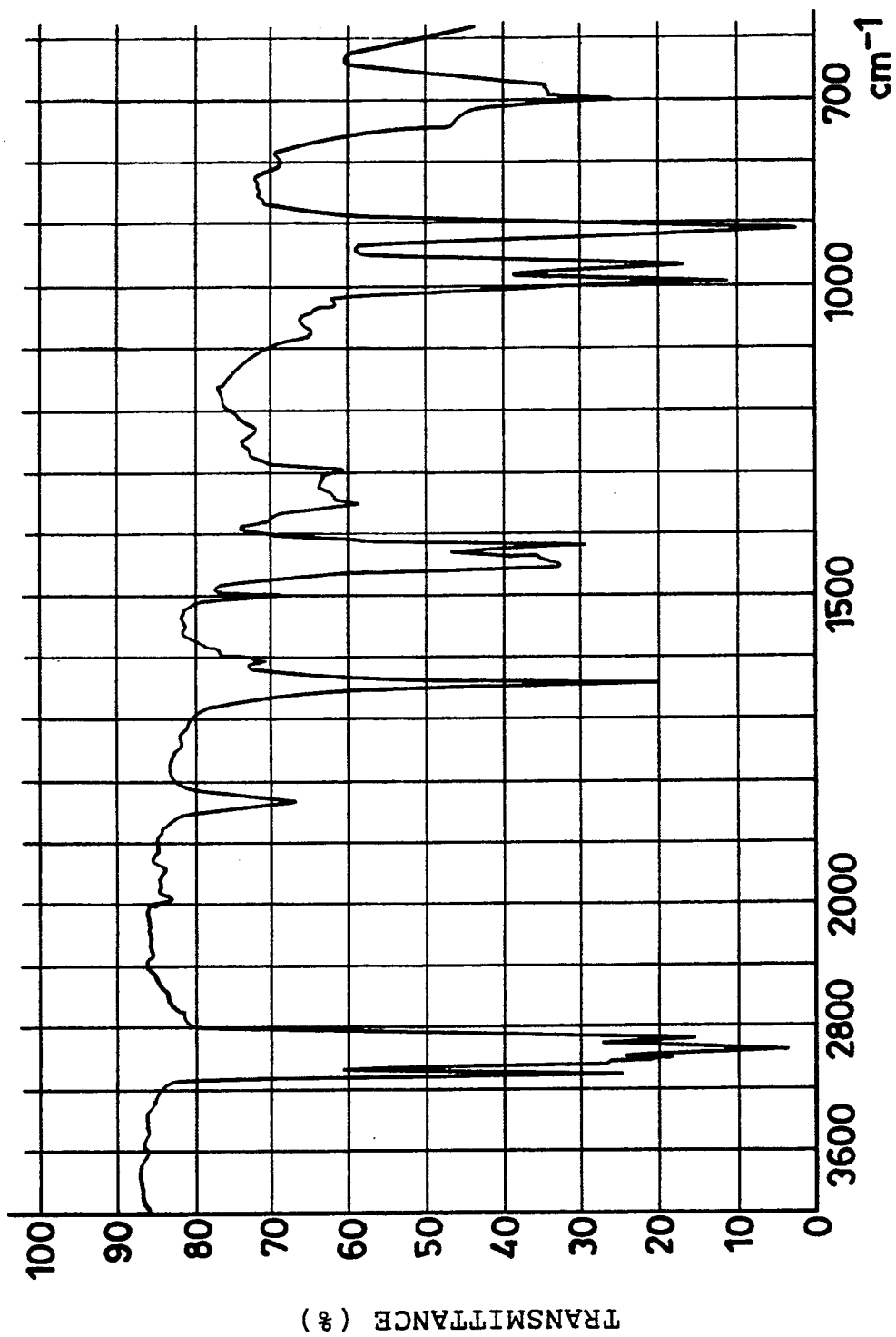
Figure 2:
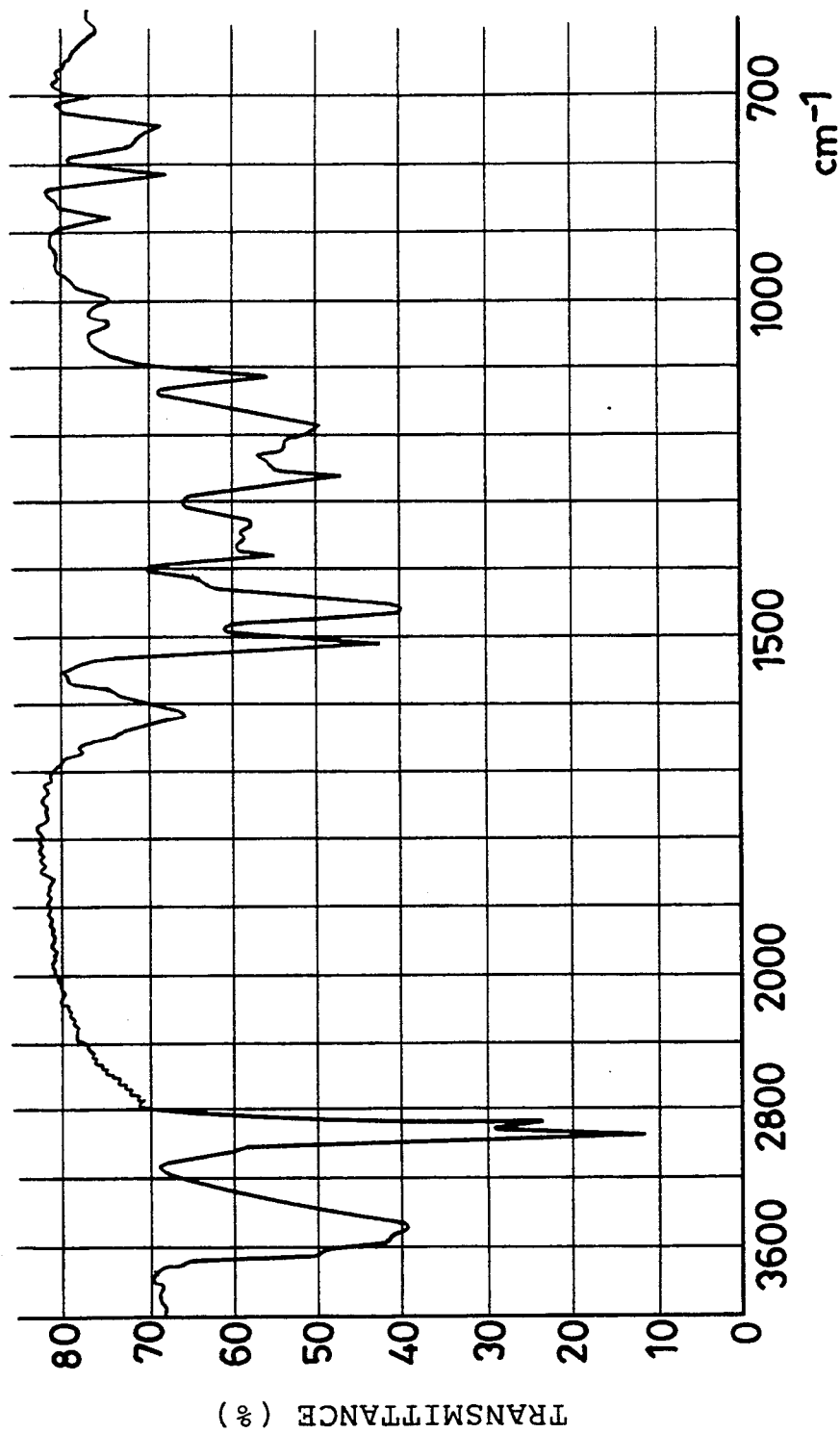
Figure 3:
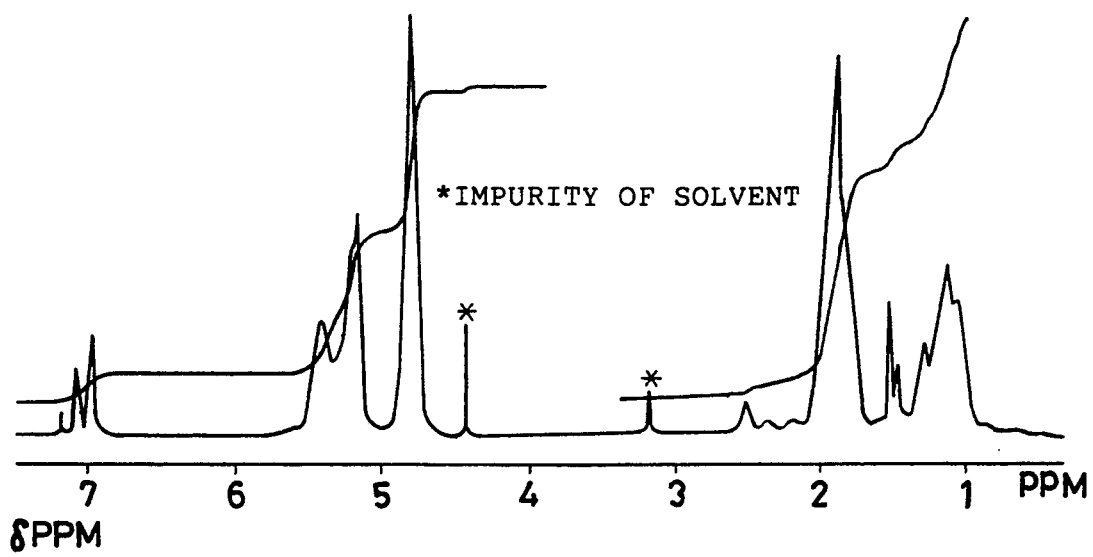
Figure 4:
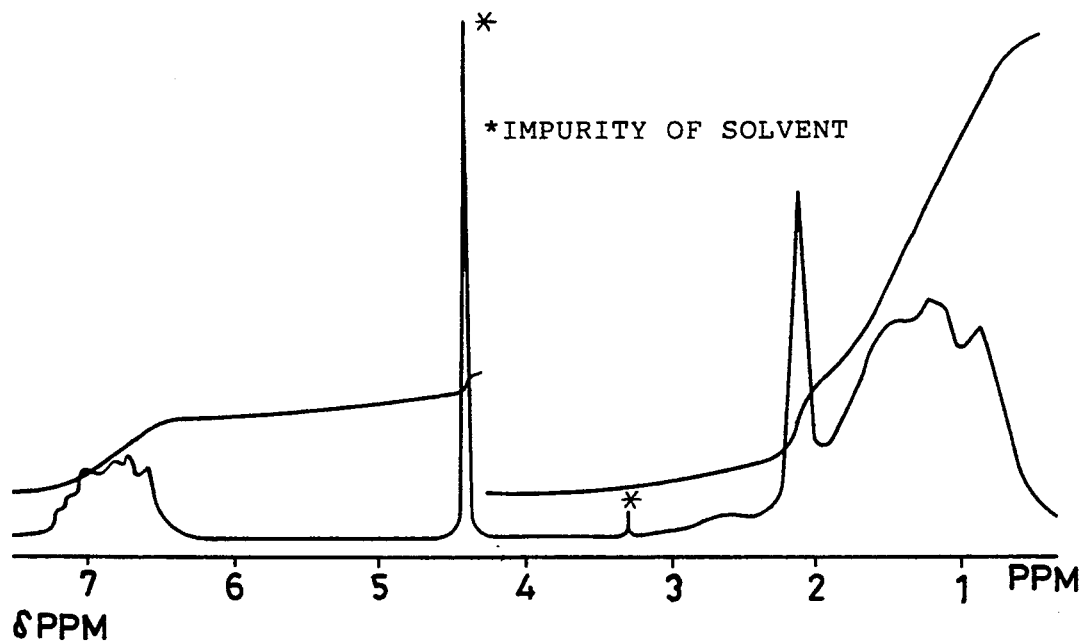
Figure 5:
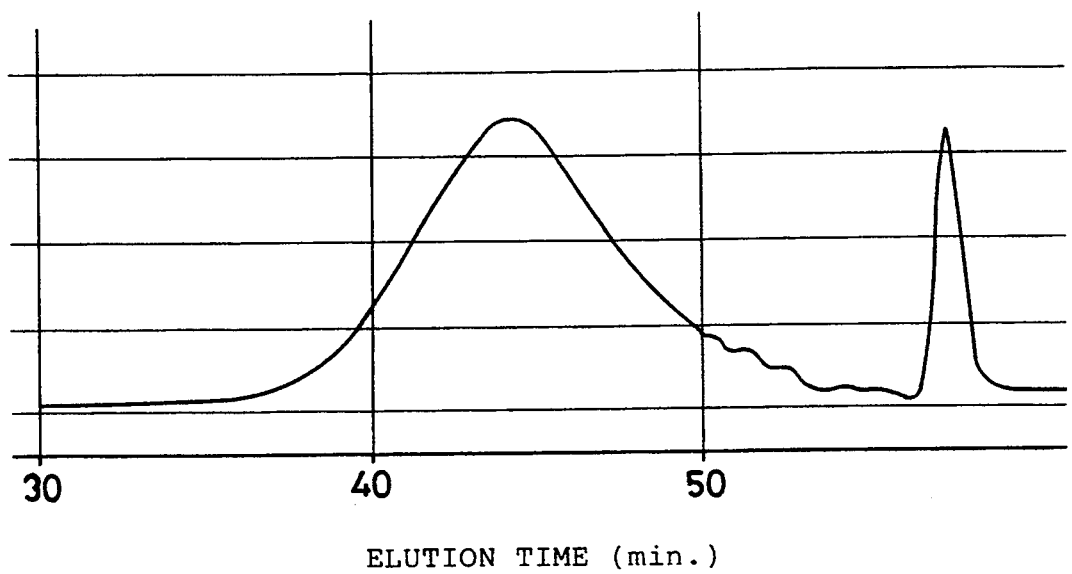
Figure 6:
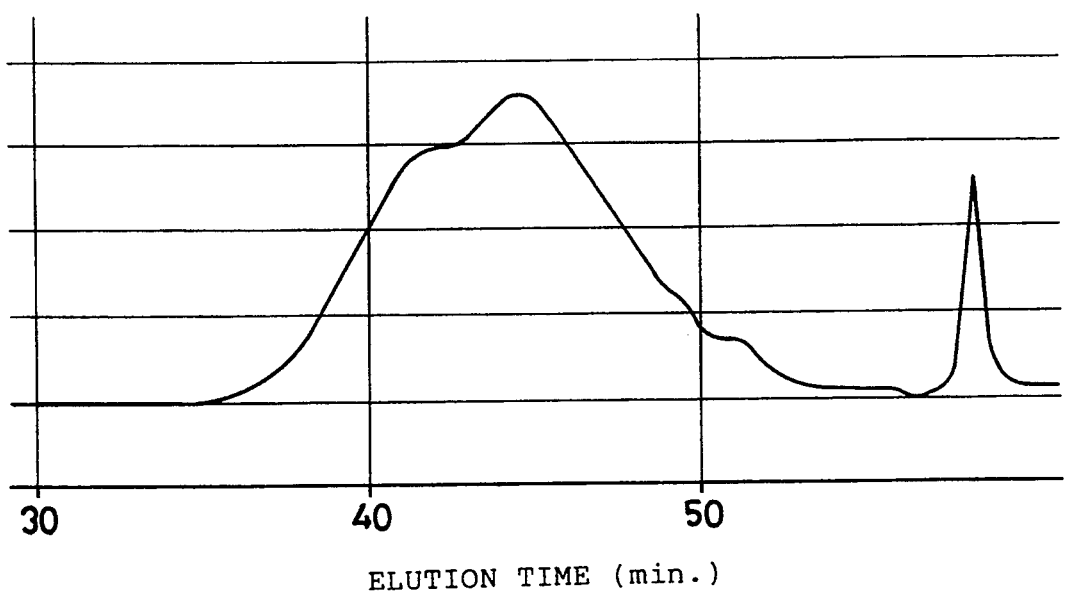
Figure 9:
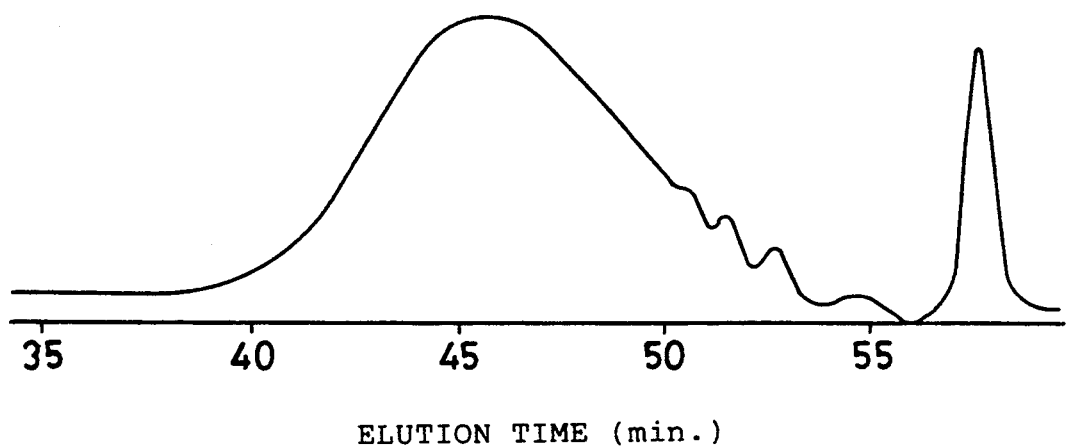
Figure 10:
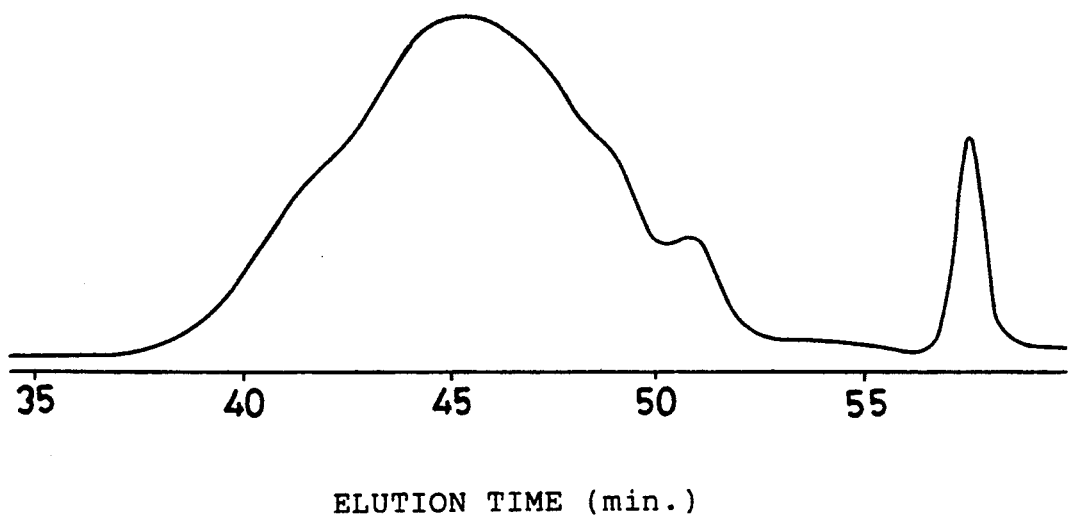

FIGS. 2 and 4 also show clearly that o-cresol links to the double bonds through alkylation reaction, not through an ether bond because no absorption due to ether bonds is detected. Further, the result of an analysis by means of GPC set forth FIGS. 9 and 10 show that no addition polymerization occurs to produce such higher molecular weight polymer/because there is no excess increase in molecular weight of the adduct beyond the weight corresponding to those of o-cresol which links to the double bonds of the butadiene polymer employed as a feed. Therefore, the double bonds in the polybutdiene as a raw material were consumed only by alkylation and cyclization reactions, not by the other side reactions. The ratio of the addition of o-cresol to the degree of cyclization was 1:2.57.

EXAMPLE 2

The same procedure as in Example 1 was repeated with the exception that NISSEKI POLYBUTADIENE B 700 having a number average molecular weight of 700 was used to prepare 485 grams of o-cresol adduct of polybutadiene (A-2) having a phenolic OH-value of 300 mmoles/100 g-resin. Analysis of the resulting adduct (A-2) by means of IR, $^1$H-NMR and GPC show that no addition polymerization to produce higher polymers occurs, and the total double bonds initially present in the polybutadiene are consumed by only alkylation of phenol and cyclization reactions.

The ratio of the addition to the degree of cyclization was 1:2.63.

EXAMPLE 3

To a similar flask described in Example 1 were fed 900 grams of phenol and 150 grams of BF$_3$ diethyl ether complex in toluene, followed by azeotropic distillation. About 140 grams of toluene was distilled off the system at a temperature of about 150° C. to reduce the water content in the reaction system to about 15 ppm by weight. The system was then cooled to 80° C., followed by addition of 330 grams of NISSEKI POLYBUTADIENE B-700 (number average molecular weight 700) containing 30 ppm of water over a period of about 3 hours through a dropping funnel. Although there was an increase in the temperature of the contents with addition of polybutadiene, the temperature was controlled by an inner cooling coil to maintain about 80° C.

Stirring was continued for about 1 hour at a temperature of about 80° C. After completion of the reaction, catalyst residue was filtered, followed by concentration of the resulting filtrate to provide 498 grams of phenol adduct (A-3).

Figure 7:
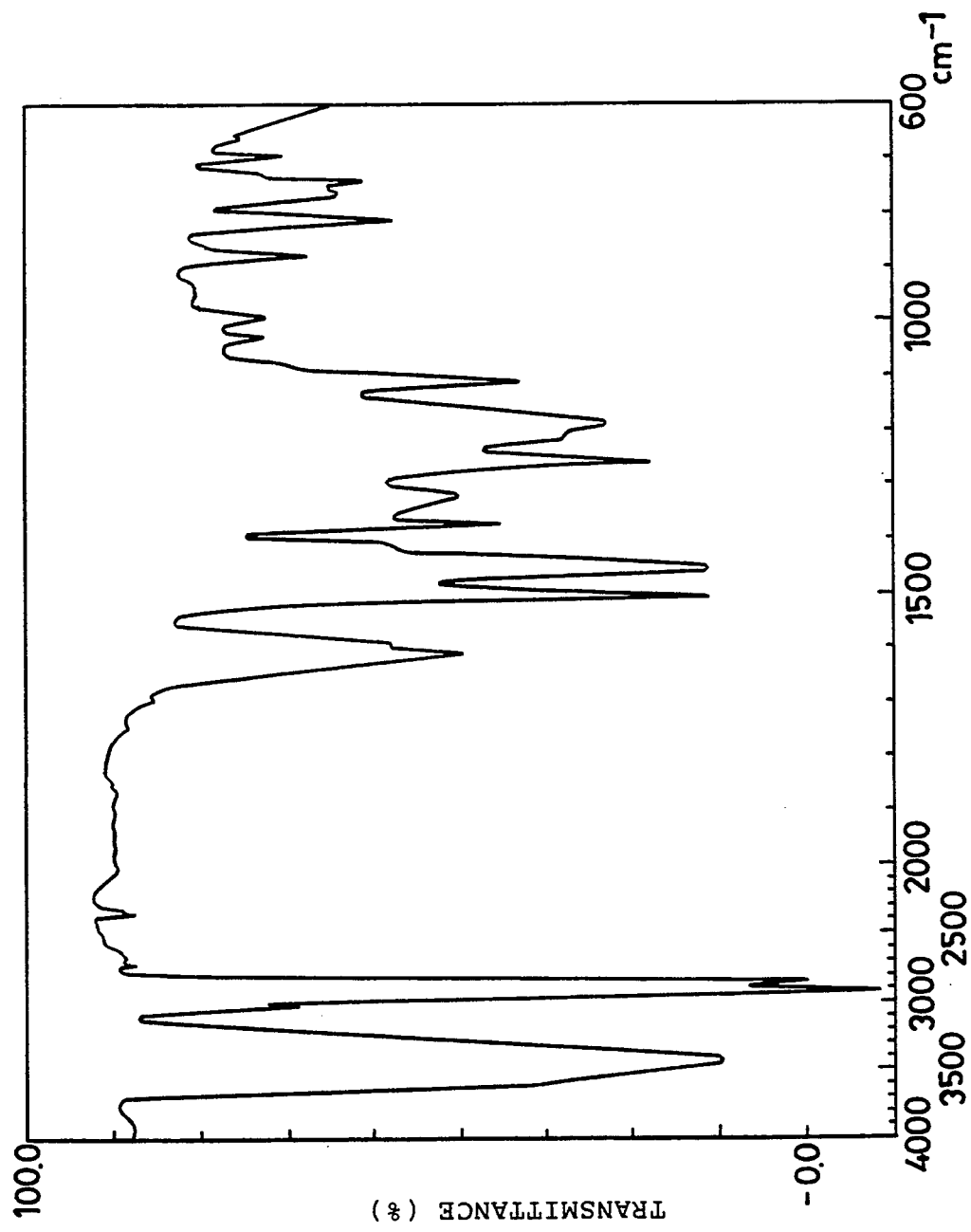
Figure 8:
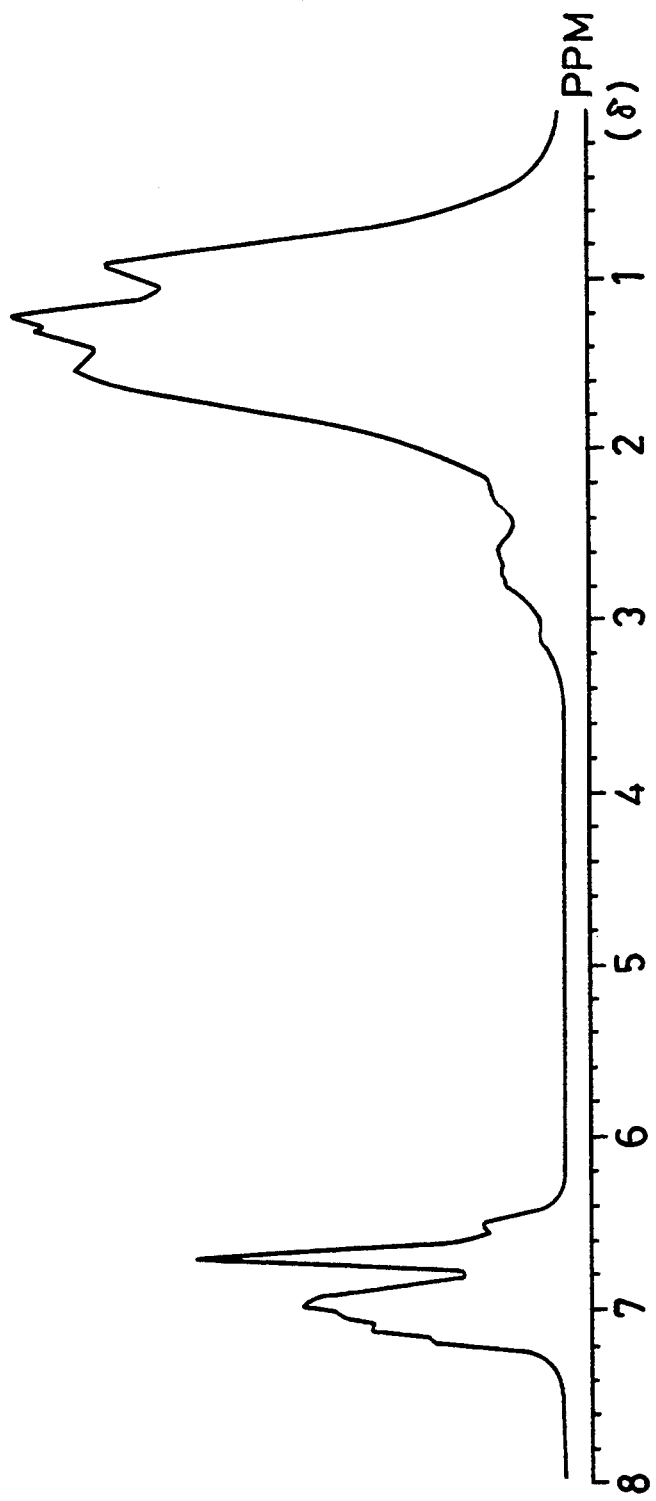

The adduct (A-3) has a softening point of 135° C. and OH-value of 340 mmoles/100 g. FIGS. 7 and 8 show the IR and $^1$H-NMR spectra wherein no absorption in IR due to double bonds at 910, 960, 990 and $1640^{-1}$ cm and no proton absorption in $^1$H-NMR due to double bonds at δ4.6 to 5.6 ppm were detected.

FIGS. 7 and 8 shows that phenol links to the double bonds through alkylaton, not through an ether bond because no absorption due to ether bonds detected. Further, the result of an analysis by means of GPC which is set forth in FIGS. 9 and 10 show that no addition polymerization between butadiene polymers occurs to produce higher molecular weight products because there is no excess increase in molecular weight of the adduct beyond the weight corresponding to those of o-cresol which links to the double bonds of the butadiene polymer.

Therefore, the double bonds of the butadiene polymer as a raw material were consumed only by alkylation reaction and cyclization reaction, not by the other side reactions. The ratio of the addition of phenol to the degree of cyclization was 1:2.22.

EXAMPLE 4

To 100 grams of the o-cresol adduct of polybutadiene (A-1) obtained in Example 1 were added 9 grams of a novolac-phenolic resin, Tamanol 759 (trade name, made by Arakawa Chemical Co. Ltd.), 82 grams of a novolac-phenolic resin, SUMIEPOXY ESCN-220 L (trade name, made by Sumitomo Chemical Ind. Ltd.), and 445 grams of a fused silica powder, FUSEROX RD-8 (trade name, made by Tatsumori Co. Lted.), followed by mixing and kneading to form an epoxy resin molding compound.

The resulting molding compound was pelletized and molded by means of a low pressure transfer molding machine at a temperature of about 175° C. under a pressure of 70 Kg/cm$^2$ for 120 seconds, followed by after-curing at 180° C. for 5 hours Sizes of the specimens were as follows:
Specimens for solder cracking test; 6×6 mm tip sealed in 52p package
Specimens for solder moisture resistance test; 2×6 mm tip sealed in 16p SOP package.

The following solder tests were carried out.

Solder Cracking Test: Solder test elements were treated under the circumstance of 85° C. and 80% RH for 48 hours or 72 hours respectively, followed by immersion of them into a solder bath at 80° C. for 10 seconds to observe the surface cracking of the test elements by means of a microscope.

Solder Moisture Resistance Test (hrs.): Scaled solder test elements were treated under the circumstance of 85° C. and 85% RH for 48 hours or 72 hours respectively, followed by immersion of them into a solder bath at 280° C. for 10 seconds to measure the hours required to develop a 50% defective of open-circuits by means of a pressure cooker method (120° C., 100% RH). The test results are set forth in Table 1.

A curable epoxy resin composition having excellent moisture resistance and solder stress resistance was obtained.

EXAMPLE 5

The same procedure as in Example 4 was repeated with the exception that o-cresol adduct of butadiene polymer (A-2) prepared in Example 2 was used to give a molding compound. The test results are set forth in Table 1.

A curable epoxy resin composition having excellent moisture resistance and solder stress resistance was obtained.

EXAMPLE 6

The same procedure as in Example 4 was repeated with the exception that phenol adduct of butadiene polymer (A-3) prepared in Example 3 was used to obtain a molding compound. Table 1 shows the test results.

A epoxy resin compound having excellent moisture resistance and solder stress resistance was obtained.

COMPARATIVE EXAMPLE 1

Into a 3-liter separable flask were fed 350 grams of NISSEKI POLYBUTADIENE B-1000 (trade name, number average molecular weight is 1,000) and 950 grams of o-cresol under an nitrogen atmosphere. The water content of the raw material by means of Karl-Fischer apparatus was 800 ppm by weight.

To the system was added dropwise 12.5 grams of BF$_3$ phenol complex at 80° C. over a period of 1 hour. Stirring was continued at 80° C. for 2 hours, followed by addition of 12.5 grams of potassium hydroxide to complete the reaction. Catalyst residue was filtered off, and the filtrate was concentrated to give 435 grams of adduct (B-1).

Figure 11:
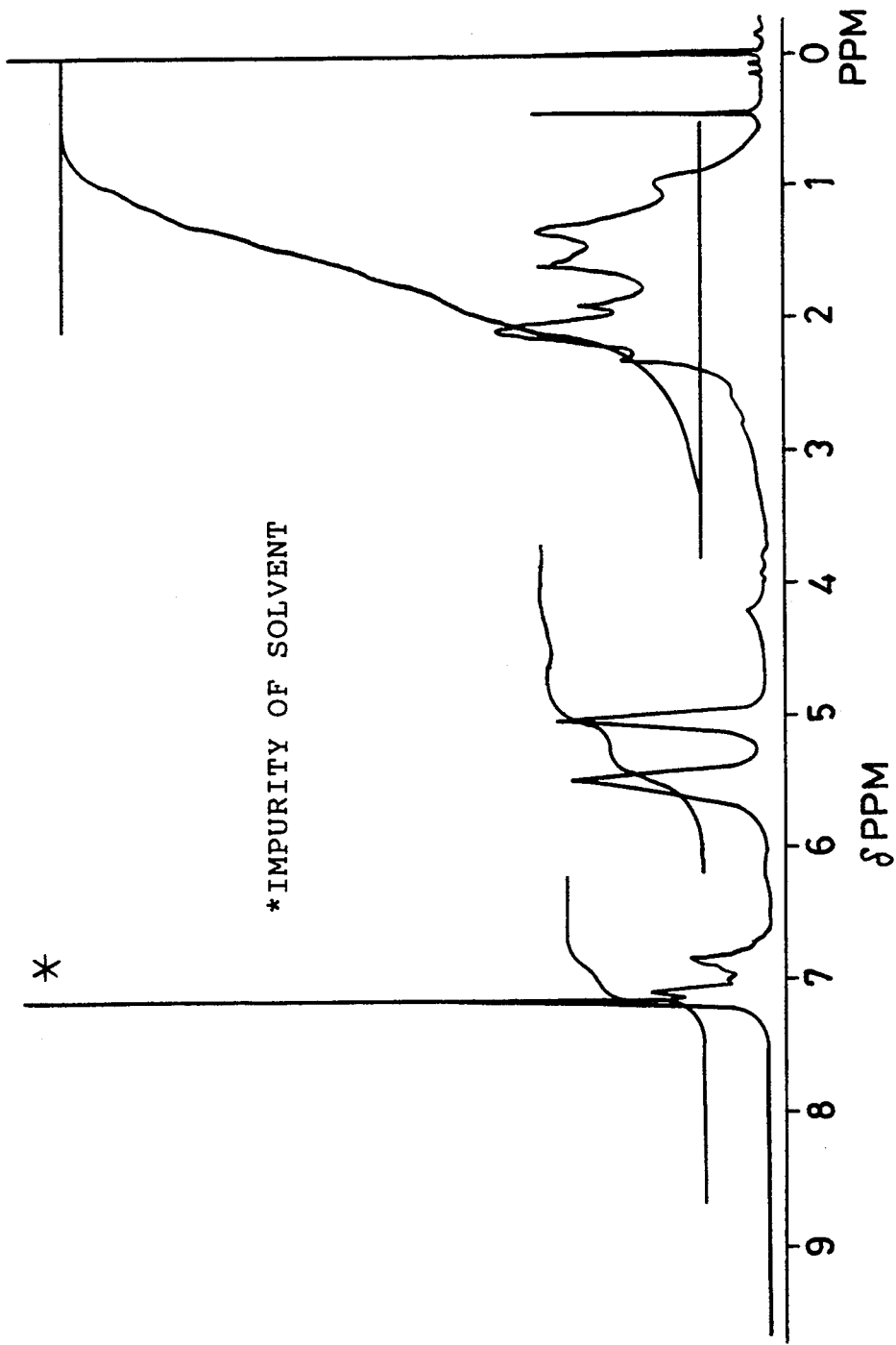
FIG. 11 is the $^1$H-NMR spectrum of cresol adduct (B-1)

The cresol adduct polybutadiene (B-1) had a softening point of 120° C. and OH-value of 210 mmoles/100 g-resin. The H-NMR spectrum of the adduct is set forth in FIG. 11, showing a fair amount of double bonds remains unchanged in the adduct. The bromine number of the adduct was 95.

COMPARATIVE EXAMPLE 2

Into 3-liter separable flask were fed 350 grams of NISSEKI POLYBUTADIENE B-1000 (trade name, 65% 1,2-, 35% 1,4), 950 grams of phenol and 200 grams of toluene. A total of 200 g. of toluene and water was distilled off of the system by azeotripic distillation as in Example 1. The water content of the raw materials measured by Karl-Fischer method was 50 ppm by weight.

To the system was added dropwise 12.1 grams of BF$_3$ phenol complex at 50° C. over a period of 1 hour.

Although there is an increase in the temperature of the contents by reaction heat with addition of catalyst, the temperature was severely controlled to maintain about 80° C. by means of inner cooling coil upon the completion of the catalyst addition.

Stirring was continued further at 80° C. for 2 hours, followed by addition of 12.0 grams of sodium hydroxide to stop the reaction. After dilution by toluene to decrease the viscosity, catalyst residue was filtered off, and the filtrate was concentrated by distillation to give 500 grams of phenol adduct (B-2).

Figure 12:
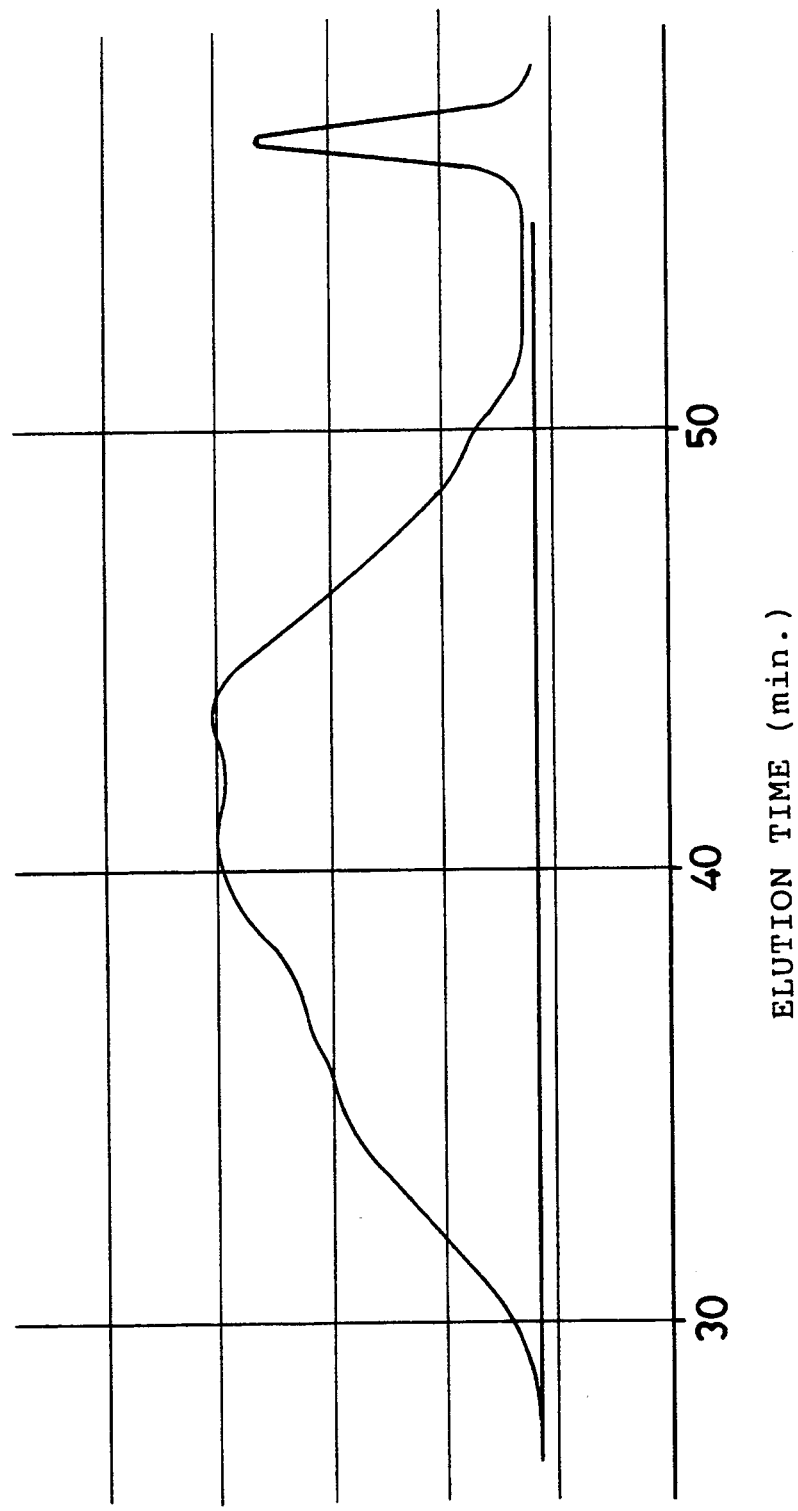
FIG. 12 is the GPC spectrum of phenol adduct (B-2).

The OH-value of the phenol adduct (B-2) was 220 mmoles/100 g-resin. According to the $^1$H-NMR spectrum, almost all double bonds were disappered, but fairly strong spectra due to ether bonds were detected. Compared with the adduct in Example 1, the GPC analysis of the adduct shows that various higher molecular weight butadiene polymers were produced during the reaction in fairly large quantities, as shown in FIG. 12.

COMPARATIVE EXAMPLE 3

The same procedures as in Examples 4 to 6 were repeated with the exception that a novolac-phenolic resin was used in place of the phenol adduct in Examples 4 to 6 to give a molding compound.

TABLE 1

|  | Examples | | | Comparative Example |
|---|---|---|---|---|
|  | 4 | 5 | 6 | 3 |
| Compositions | | | | |
| Cresol novolac-type epoxy (g) | 82 | 82 | 82 | 68 |
| Phenol novolac (g) | 9 | 9 | 9 | 32 |
| O-cresol adduct of polybutadiene (g) | 100 | 100 | 100 | — |
| Triphenylphosphine (g) | 0.2 | 0.2 | 0.2 | 0.2 |
| Carnauba Wax (g) | 0.5 | 0.5 | 0.5 | 0.5 |
| Sb$_2$O$_3$ (g) | 8 | 8 | 8 | 8 |
| Carbon black (g) | 0.5 | 0.5 | 0.5 | 0.5 |
| Coupling agent (g) | 0.5 | 0.5 | 0.5 | 0.5 |
| Fused silica powder (g) | 445 | 445 | 445 | 235 |
| Properties | | | | |
| Spiral flow (inche) | 20 | 28 | 20 | 40 |
| Glass transition point (°C.) | 150 | 140 | 152 | 160 |
| Flexural modulus (Kg/cm$^2$) | 1300 | 1250 | 1320 | 1400 |
| Solder moisture resistance average life (hr.) | 300< | 300< | 300< | 100 |
| Solder cracking test (cracked Nos./total Nos.) | 0/6 | 0/16 | 16/16 | 16/1 |

Spiral flow; EMMI-1-66,
Flexural modulus; JIS K-6911
Tg; TMA Method

UTILITY OF THE PRESENT INVENTION

According to the process of the present invention, a novel resin having cycloalkane-type main chains and a number of phenolic hydroxyl groups in the side chains can be prepared from a low molecular weight butadiene polymer and a phenol as starting materials.

Such a specific novel resin of the present invention can be prepared only when the content of water in raw materioals is severely controlled.

The present hydroxyphenylated resin having excellent thermal stability and electrical properties is suitable for use as a resin for printed circuit boards, a resin for sealing semiconductors, brake shoes, and the like. Especially, setting products made by curing the epoxy resin composition used for sealing materials have excellent mechanical and electrical properties and moisture resistance as well as cracking resistance.

Further, the phenol adduct or phenol derivative adduct of a low molecular weight butadiene polymer of the present invention has no double bonds in the molecule, and the setting products prepared from the curable epoxy composition comprising the adduct are characterized by the excellent thermal stability.

As described above, the novel resin and the composition comprising the same can be widely used in the industrial fields.

What is claimed is:

1. A curable epoxy resin composition comprising, as its essential components:
   (A) about 100 parts by weight of a hydroxy (alkyl) phenylated resin having a number average molecular weight of about 500 to 5,000, whose repeating unit is represented by the formula:

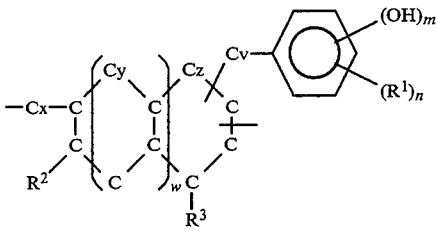

wherein R$^1$ is a hydrogen atom, a halogen atom or an alkyl group having 1 to 4 carbon atoms, R$^2$ and R$^3$ are a hydrogen atom, a methyl or ethyl group, m is 1 or 2, n is 0 to 2, x is 1 or 2, y, z and v are individually 0 or 1, w is 0 to 2, and the sum total of carbon numbers except those of the hydroxyphenyl group are the multiples of 4

(B) about 20 to 120 parts by weight of a curable epoxy resin, and
   (C) about 0.05 to 5.0 parts by weight of an accelerator.

2. The curable epoxy resin composition of claim 1 in which the hydroxy (alkyl) phenylated resin has an unsaturated double bond content of less than about 2 mol % and a mole ratio of hydroxy (alkyl) phenyl groups to the degrees of cyclization of polycycloalkane rings of 1:1 to 1:3.

3. The curable epoxy resin composition of claim 2 in which the softening point of the hydroxy (alkyl) phenylated resin is at least about 90° C.

4. The curable epoxy resin composition of claim 3 in which the softening point of the hydroxy (alkyl) phenylated resin is about 100° to 200° C.

5. The curable epoxy resin composition of claim 1 in which n is 0.

6. The curable epoxy resin composition of claim 5 in which m is 1.

7. The curable epoxy resin composition of claim 1 in which m and n are 1.

8. The curable epoxy resin composition of claim 1 in which the hydroxy (alkyl) phenylated resin is the reaction product of a butadiene polymer having a number average molecular weight of about 300 to 3000 and an alkyl phenol of the formula

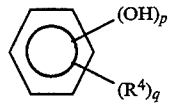

in which R$^4$ is a halogen atom or an alkyl group having 1 to 4 carbon atoms, p is 0, 1 or 2 and q is 1 or 2 in the presence of a boron trifluoride containing catalyst and in the presence of an amount of water of not more than about 100 ppm by weight.

9. The curable epoxy resin composition of claim 8 in which the amount of water was less than about 60 ppm.

10. The curable epoxy resin composition of claim 8 in which p is 0.

11. The curable epoxy resin composition of claim 8 in which p is 1.

12. The curable epoxy resin composition of claim 8 in which p and q are each 1.

* * * * *